United States Patent
Kaiser et al.

(10) Patent No.: US 9,611,551 B2
(45) Date of Patent: *Apr. 4, 2017

(54) LAYER SYSTEM COMPRISING GADOLINIUM SOLID SOLUTION PYROCHLORE PHASE

(75) Inventors: Axel Kaiser, Neuss (DE); Eckart Schumann, Meülheim an der Ruhr (DE); Ramesh Subramanian, Oviedo, FL (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 1996 days.

This patent is subject to a terminal disclaimer.

(21) Appl. No.: 12/085,399

(22) PCT Filed: Oct. 17, 2006

(86) PCT No.: PCT/EP2006/067497
§ 371 (c)(1),
(2), (4) Date: Dec. 19, 2008

(87) PCT Pub. No.: WO2007/060062
PCT Pub. Date: May 31, 2007

(65) Prior Publication Data
US 2009/0162648 A1    Jun. 25, 2009

(30) Foreign Application Priority Data

Nov. 24, 2005 (EP) ...................... 05025690

(51) Int. Cl.
*B32B 7/00* (2006.01)
*B32B 15/00* (2006.01)
(Continued)

(52) U.S. Cl.
CPC ............... *C23C 30/00* (2013.01); *C23C 4/11* (2016.01); *C23C 14/08* (2013.01); *C23C 28/321* (2013.01);
(Continued)

(58) Field of Classification Search
CPC  C23C 14/08; C23C 30/00; C23C 4/11; C23C 28/345; C23C 28/3455; C23C 28/3215
(Continued)

(56) References Cited

U.S. PATENT DOCUMENTS 4,034,142 A * 7/1977 Hecht ........................... 428/678
4,419,416 A * 12/1983 Gupta et al. ................. 428/656
(Continued)

FOREIGN PATENT DOCUMENTS

DE    10158639 A1    10/2002
DE    10200803 A1    7/2003
(Continued)

OTHER PUBLICATIONS

Karaulov et al. "Phase Formation in the ZrO2—HfO2—Gd2O3 and ZrO2—HfO2—Yb2O3 Systems". Refractories and Industrial Ceramics, vol. 40, Nos. 11-12, (1999). pp. 479-483.*

*Primary Examiner* — Prashant J Khatri

(57) ABSTRACT

Heat insulating layered systems should have a long service life in addition to excellent heat-insulating properties. Disclosed in an inventive layered system consisting of an external ceramic layer that has a mixed crystal consisting of gadolinium zirconate and gadolinium hafnate.

15 Claims, 4 Drawing Sheets

(51) Int. Cl.
  *B32B 15/04* (2006.01)
  *C23C 30/00* (2006.01)
  *C23C 14/08* (2006.01)
  *C23C 28/00* (2006.01)
  *C23C 4/11* (2016.01)

(52) U.S. Cl.
  CPC ........ *C23C 28/3215* (2013.01); *C23C 28/345* (2013.01); *C23C 28/3455* (2013.01); *Y02T 50/67* (2013.01); *Y10T 428/266* (2015.01); *Y10T 428/31678* (2015.04)

(58) Field of Classification Search
  USPC ........ 428/212–213, 216, 688–689, 697–699, 428/701–702; 501/132, 134, 152; 420/435–437, 580–586, 588, 441–443, 420/445; 416/241 B
  See application file for complete search history.

(56) References Cited

U.S. PATENT DOCUMENTS

| | | | |
|---|---|---|---|
| 5,507,623 A * | 4/1996 | Kojima et al. | 416/241 R |
| 6,117,560 A | 9/2000 | Maloney | |
| 6,177,200 B1 | 1/2001 | Maloney | |
| 6,231,991 B1 | 5/2001 | Maloney | |
| 6,258,467 B1 | 7/2001 | Subramanian | |
| 6,756,131 B2 * | 6/2004 | Oguma et al. | 428/632 |
| 2001/0007719 A1 | 7/2001 | Maloney | |
| 2003/0049470 A1 | 3/2003 | Maloney | |
| 2004/0038085 A1 | 2/2004 | Litton et al. | |
| 2004/0180233 A1 * | 9/2004 | Stamm | 428/680 |
| 2005/0238907 A1 | 10/2005 | Quadakkers et al. | |

FOREIGN PATENT DOCUMENTS

| | | | |
|---|---|---|---|
| EP | 0713957 A1 | 5/1996 | |
| EP | 0848077 A1 | 6/1998 | |
| EP | 0897996 A1 | 2/1999 | |
| EP | 0992603 A1 | 4/2000 | |
| EP | 0944746 B1 | 7/2001 | |
| EP | 1321542 A1 | 6/2003 | |
| EP | 1380672 A1 | 1/2004 | |
| JP | 05041237 | 2/1993 | |
| JP | 2000119870 A | 4/2000 | |
| WO | WO 2005019370 A2 | 3/2005 | |

* cited by examiner

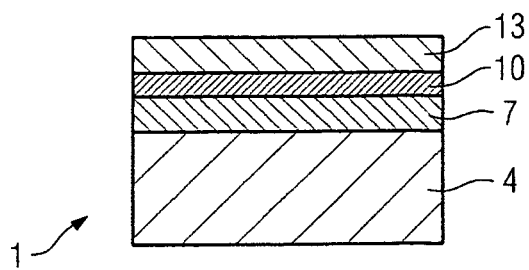
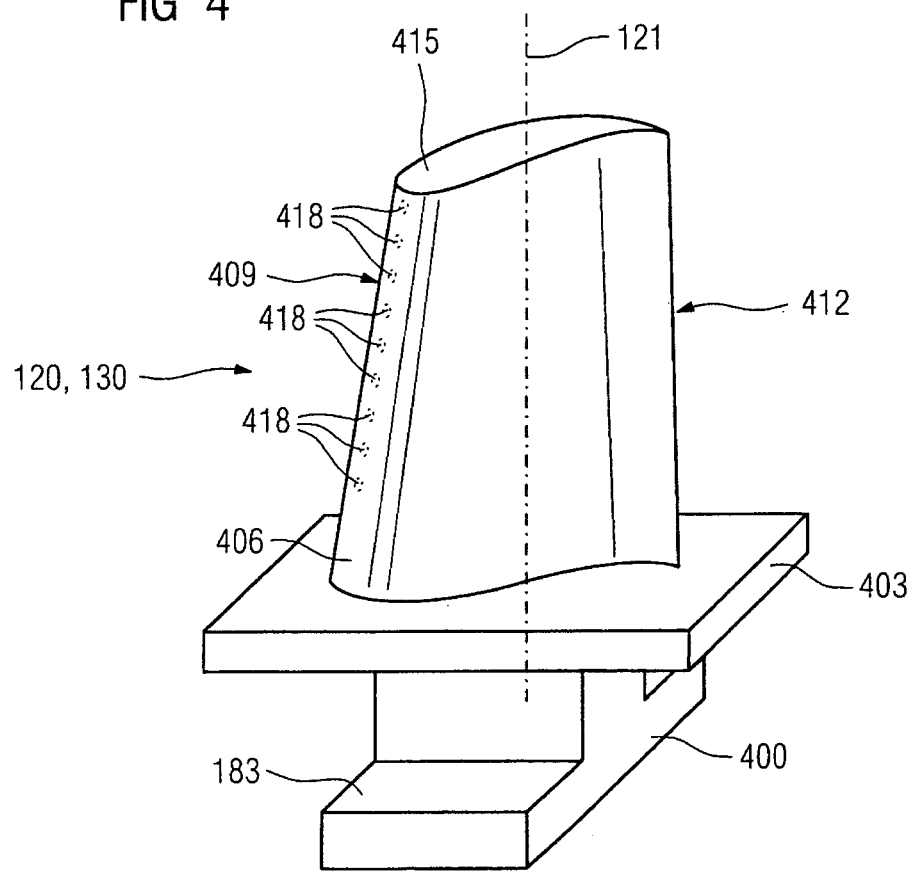

FIG 2

| Material | chemical composition in % | | | | | | | | | | | | |
|---|---|---|---|---|---|---|---|---|---|---|---|---|---|
| | C | Cr | Ni | Co | Mo | W | Ta | Nb | Al | Ti | B | Zr | Hf |
| Ni-base investment casting alloys | | | | | | | | | | | | | |
| GTD 222 | 0.10 | 22.5 | Rest | 19.0 | | 2.0 | 1.0 | | 1.2 | 2.3 | 0.008 | | |
| IN 939 | 0.15 | 22.4 | Rest | 19.0 | | 2.0 | 1.4 | 1.0 | 1.9 | 3.7 | 0.009 | 0.10 | |
| IN 6203 DS | 0.15 | 22.0 | Rest | 19.0 | | 2.0 | 1.1 | 0.8 | 2.3 | 3.5 | 0.010 | 0.10 | 0.75 |
| Udimet 500 | 0.10 | 18.0 | Rest | 18.5 | 4.0 | | | | 2.9 | 2.9 | 0.006 | 0.05 | |
| IN 738 LC | 0.10 | 16.0 | Rest | 8.5 | 1.7 | 2.6 | 1.7 | 0.9 | 3.4 | 3.4 | 0.010 | 0.10 | |
| SC 16 | <0.01 | 16.0 | Rest | | 3.0 | | 3.5 | | 3.5 | 3.5 | <0.005 | <0.008 | |
| Rene 80 | 0.17 | 14.0 | Rest | 9.5 | 4.0 | 4.0 | | | 3.0 | 5.0 | 0.015 | 0.03 | |
| GTD 111 | 0.10 | 14.0 | Rest | 9.5 | 1.5 | 3.8 | 2.8 | | 3.0 | 4.9 | 0.012 | 0.03 | |
| GTD 111 DS | | | | | | | | | | | | | |
| IN 792 CC | 0.08 | 12.5 | Rest | 9.0 | 1.9 | 4.1 | 4.1 | | 3.4 | 3.8 | 0.015 | 0.02 | |
| IN 792 DS | 0.08 | 12.5 | Rest | 9.0 | 1.9 | 4.1 | 4.1 | | 3.4 | 3.8 | 0.015 | 0.02 | 1.00 |
| MAR M 002 | 0.15 | 9.0 | Rest | 10.0 | | 10.0 | 2.5 | | 5.5 | 1.5 | 0.015 | 0.05 | 1.50 |
| MAR M 247 LC DS | 0.07 | 8.1 | Rest | 9.2 | 0.5 | 9.5 | 3.2 | | 5.6 | 0.7 | 0.015 | 0.02 | 1.40 |
| CMSX·2 | <.006 | 8.0 | Rest | 4.6 | 0.6 | 8.0 | 6.0 | | 5.6 | 1.0 | <.003 | <.0075 | 0.10 |
| CMSX·3 | <.006 | 8.0 | Rest | 4.6 | 0.6 | 8.0 | 6.0 | | 5.6 | 1.0 | <.003 | <.0075 | 0.10 |
| CMSX·4 | | 6.0 | Rest | 10.0 | 0.6 | 6.0 | 6.0 | | 5.6 | 1.0 | | Re=3.0 | |
| CMSX·6 | <.015 | 10.0 | Rest | 5.0 | 3.0 | <.10 | 2.0 | <.10 | 4.9 | 4.8 | <.003 | <.0075 | 0.10 |
| PWA 1480 SX | <.006 | 10.0 | Rest | 5.0 | | 4.0 | 12.0 | | 5.0 | 1.5 | <.0075 | <.0075 | |
| PWA 1483 SX | 0.07 | 12.2 | Rest | 9.0 | 1.9 | 3.8 | 5.0 | | 3.6 | 4.2 | 0.0001 | 0.002 | |
| Co-base investment casting alloys | | | | | | | | | | | | | |
| FSX 414 | 0.25 | 29.0 | 10 | Rest | | 7.5 | | | | | 0.010 | | |
| X 45 | 0.25 | 25.0 | 10 | Rest | | 8.0 | | | | | 0.010 | | |
| ECY 768 | 0.65 | 24.0 | 10 | 51.7 | | 7.5 | 4.0 | | 0.25 | 0.3 | 0.010 | 0.05 | |
| MAR-M-509 | 0.65 | 24.5 | 11 | Rest | | 7.5 | 4 | | | 0.3 | 0.010 | 0.60 | |
| CM 247 | 0.07 | 8.3 | Rest | 10.0 | 0.5 | 9.5 | 3.2 | | 5.5 | 0.7 | | | 1.5 |

LAYER SYSTEM COMPRISING GADOLINIUM SOLID SOLUTION PYROCHLORE PHASE

CROSS REFERENCE TO RELATED APPLICATIONS

This application is the US National Stage of International Application No. PCT/EP2006/067497, filed Oct. 17, 2006 and claims the benefit thereof. The International Application claims the benefits of European application No. 05025690.8 filed Nov. 24, 2005, both of the applications are incorporated by reference herein in their entirety.

FIELD OF INVENTION

The invention relates to a layer system comprising pyrochlores.

BACKGROUND OF THE INVENTION

A layer system of this type has a substrate with a metal alloy based on nickel or cobalt. Products of this type are used in particular as a component of a gas turbine, in particular as gas turbine blades or vanes or heat shields. The components are exposed to a hot-gas stream of aggressive combustion gases. Therefore, they have to be able to withstand high thermal stresses. Furthermore, it is necessary for these components to be resistant to oxidation and corrosion. Moreover, mechanical demands are imposed in particular on moving components, e.g. gas turbine blades or vanes, but also on static components. The power and efficiency of a gas turbine in which components that can be exposed to hot gas are used increase as the operating temperature rises. To achieve a high efficiency and a high power, components of the gas turbines which are particularly exposed to the high temperatures are coated with a ceramic material. This acts as a thermal barrier coating between the hot-gas stream and the metallic substrate.

The metallic base body is protected from the aggressive hot-gas stream by coatings. Modern components generally have a plurality of coatings, which each perform specific tasks. Therefore, a multilayer system is employed.

Since the power and efficiency of gas turbines rise as the operating temperature increases, constant attempts have been made to achieve a higher gas turbine performance by improving the coating system.

EP 0 944 746 B1 discloses the use of pyrochlores as a thermal barrier coating. However, it is not only good thermal barrier properties which are required for a material to be used as a thermal barrier coating, but also a good bonding to the substrate.

EP 0 992 603 A1 discloses a thermal barrier coating system made up of gadolinium oxide and zirconium oxide, which is not supposed to have a pyrochlore structure.

SUMMARY OF INVENTION

Therefore, it is an object of the invention to provide a layer system which has good thermal barrier properties and also good bonding to the substrate and therefore a long service life.

The object is achieved by a layer system as claimed in the claims.

The invention is based on the discovery that the entire system must be considered as a single unit, rather than individual layers or individual layers in combination having to be considered and optimized in isolation from one another in order to achieve a long service life.

The subclaims list further advantageous measures, which can be advantageously combined with one another as desired.

The layer system according to the invention comprises an outer ceramic layer, which includes a solid solution of gadolinium zirconate and gadolinium hafnate, which has particularly good thermal properties (expansion coefficient matched to the substrate, low coefficient of thermal conductivity) and harmonizes very well with an intermediate layer and the substrate of the component.

BRIEF DESCRIPTION OF THE DRAWINGS

Exemplary embodiments of the invention are explained in more detail below with reference to the drawings.

In which:
FIG. 1 shows a layer system according to the invention,
FIG. 2 shows compositions of super alloys,
FIG. 4 shows a perspective view of a turbine blade or vane.

DETAILED DESCRIPTION OF INVENTION

Figure 3:
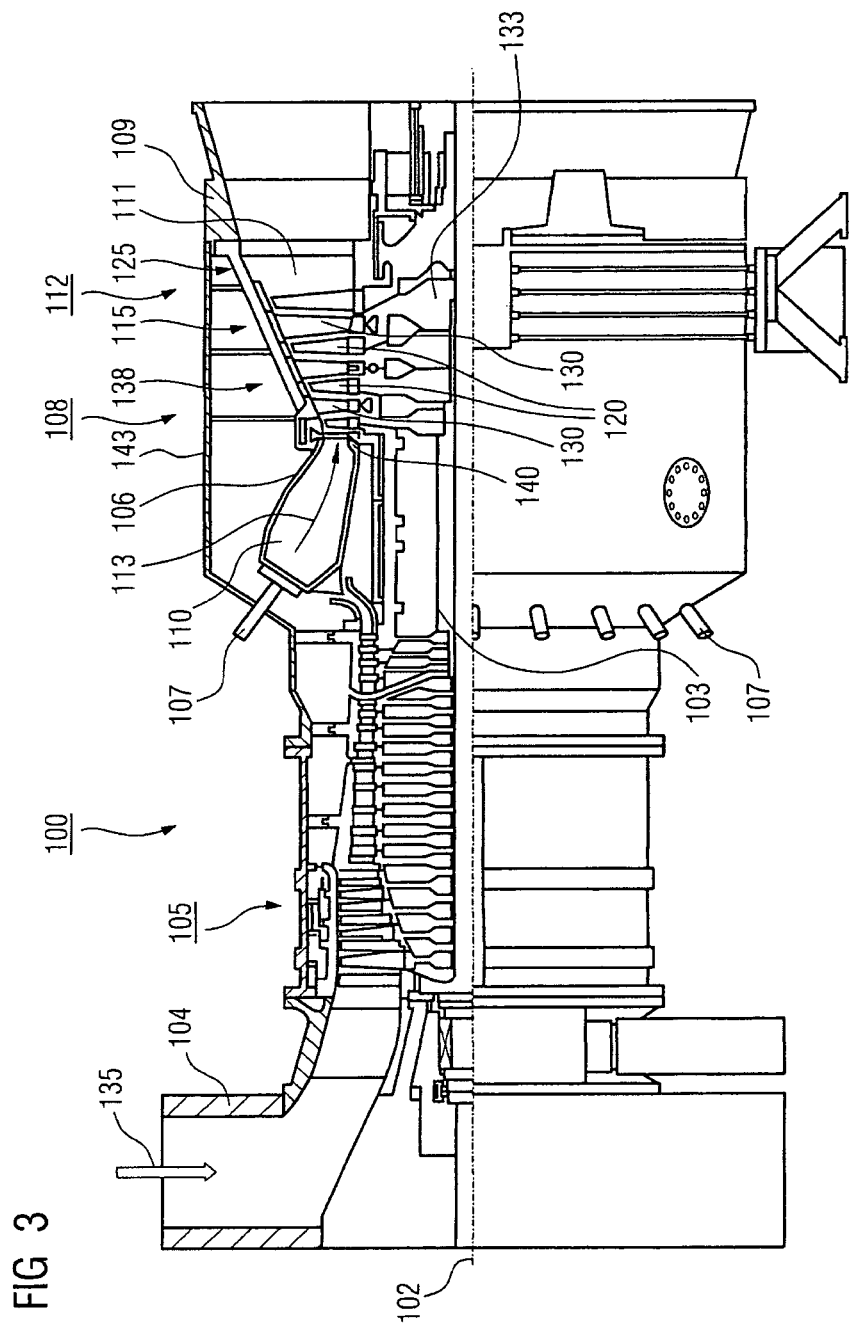
FIG. 3 shows a gas turbine.

FIG. 1 shows a layer system 1 according to the invention.

The layer system 1 comprises a metallic substrate 4, which in particular for components used at high temperatures consists of a nickel-base or cobalt-base super alloy (FIG. 2).

A metallic bonding layer 7 of type MCrAlX, in particular of type NiCoCrAlX is preferably present directly on the substrate 4 and preferably consists of either

| | |
|---|---|
| (11-13) wt % | cobalt, in particular 12 wt % cobalt, |
| (20-22) wt % | chromium, in particular 21 wt % chromium, |
| (10.5-11.5) wt % | aluminum, in particular 11 wt % aluminum, |
| (0.3-0.5) wt % | yttrium (= X), in particular 0.4 wt % yttrium, |
| (1.5-2.5) wt % | rhenium, in particular 2.0 wt % rhenium, and remainder nickel or preferably of |
| (24-26) wt % | cobalt, in particular 25 wt % cobalt, |
| (16-18) wt % | chromium, in particular 17 wt % chromium, |
| (9.5-10.5) wt % | aluminum, in particular 10 wt % aluminum, |
| (0.3-0.5) wt % | yttrium(= X), in particular 0.4 wt % yttrium, |
| (1.0-2.0) wt % | rhenium and in particular 1.5 wt % rhenium remainder nickel, or preferably of |
| 29%-31% | nickel, in particular 30% nickel, |
| 27%-29% | chromium, in particular 28% chromium, |
| 7%-9% | aluminum, in particular 8% aluminum, |
| 0.5%-0.7% | yttrium, in particular 0.6% yttrium, |
| 0.6%-0.8% | silicon, in particular 0.7% silicon and remainder cobalt, or preferably of |
| 27%-29% | nickel, in particular 28% nickel, |
| 23%-25% | chromium, in particular 24% chromium, |
| 9%-11% | aluminum, in particular 10% aluminum, |
| 0.3%-0.7% | yttrium, in particular 0.6% yttrium and remainder cobalt. |

In particular, the NiCoCrAlY bonding layer 7 consists of one of these compositions.

On this metallic bonding layer 7, an aluminum oxide layer has formed even before the application of further ceramic layers or such an aluminum oxide layer (TGO) is formed in operation.

An inner ceramic layer 10, preferably a fully or partially stabilized zirconium oxide layer, is preferably present on the metallic bonding layer 7 or on the aluminum oxide layer (not shown). It is preferable to use yttrium-stabilized zirconium oxide, preferably using 6 wt %-8 wt % yttrium. It is equally possible to use calcium oxide, cerium oxide and/or hafnium oxide to stabilize zirconium oxide.

The zirconium oxide is preferably applied as a plasma-sprayed layer, and may preferably also be applied as a columnar structure by means of electron beam physical vapor deposition (EBPVD).

An outer ceramic layer 13, which according to the invention comprises a solid solution of gadolinium, hafnium and zirconium with a pyrochlore structure, has been applied to the TGO, to the bonding layer 7 or to the inner layer 10.

A pyrochlore structure has the empirical formula $A_2B_2O_7$ or in general terms $A_vB_xO_z$ where v=2, x=2 and z=7. Deviations from this stoichiometric composition for v, x and z may occur as a result of vacancies or minor, deliberate or undeliberate doping.

For the outer ceramic layer 13 according to the invention, gadolinium (Gd) is used for A, hafnium and zirconium (Hf, Zr) are used for B, i.e. a solid solution structure $Gd_v(Hf_xZr_y)O_z$. In this case too, minor deviations from this stoichiometry may occur.

Preferably, the outer ceramic layer 13 comprises $Gd_v(Hf_xZr_y)O_z$ where x+y=2.

Preferably, the outer ceramic layer 13 also comprises $Gd_v(Hf_xZr_y)O_7$.

Preferably, the outer ceramic layer 13 comprises $Gd_2(Hf_xZr_y)O_z$.

Preferably, the outer ceramic layer 13 consists of $Gd_V(Hf_xZr_y)O_Z$, in particular where v=2, x+y=2 and z=7.

It is possible to use any desired mixing ratios y:x of zirconium and hafnium.

It is preferable to use a larger proportion of zirconium.

It is also preferable to use mixing ratios of 10:90, 20:80, 30:70 or 40:60 for hafnium to zirconium.

It is also advantageous to use mixing ratios of 50:50, 60:40, 70:30, 80:20 or 90:10 for hafnium to zirconium.

For the ratios of x to y, therefore, the abovementioned details advantageously apply to the ratio of hafnium to zirconium (Hf:Zr=80:20, corresponding to y:x=1.6:0.4).

The layer may have been produced from a powder which results in the proportions of the abovementioned composition. It is also possible for the solid solutions to be produced during the coating process or by a heat treatment following the coating process.

The layer thickness of the inner layer 10 is preferably between 10% and 50% of the total layer thickness D of inner layer 10 and outer layer 13.

It is preferable for the layer thickness of the inner layer 10 to be between 10% and 40% or between 10% and 30% of the total layer thickness.

It is likewise advantageous if the layer thickness of the inner layer 10 amounts to 10% to 20% of the total layer thickness.

It is also preferable for the layer thickness of the inner layer 10 to be between 20% and 50% or between 20% and 40% of the total layer thickness.

Advantageous results are likewise achieved if the inner layer 10 forms between 20% and 30% of the total layer thickness.

It is preferable for the layer thickness of the inner layer 10 to amount to 30% to 50% of the total layer thickness.

It is likewise advantageous if the layer thickness of the inner layer 10 makes up 30% to 40% of the total layer thickness.

It is likewise preferable if the layer thickness of the inner layer 10 makes up between 40% and 50% of the total layer thickness.

Although the pyrochlore phase has better thermal barrier properties than the $ZrO_2$-layer, the $ZrO_2$-layer may be made of equal thickness to the pyrochlore phase.

The inner ceramic layer 10 preferably has a thickness of from 40 μm to 60 μm, in particular 50 μm±10%.

The total layer thickness of the inner layer 10 and the outer layer 13 is preferably 300 μm or preferably 400 μm. The maximum total layer thickness is advantageously 800 μm or preferably at most 600 μm.

FIG. 3 shows, by way of example, a partial longitudinal section through a gas turbine 100.

In the interior, the gas turbine 100 has a rotor 103, with a shaft 101, which is mounted such that it can rotate about an axis of rotation 102 and is also referred to as the turbine rotor.

An intake housing 104, a compressor 105, a, for example, torroidal combustion chamber 110, in particular an annular combustion chamber, with a plurality of coaxially arranged burners 107, a turbine 108 and the exhaust-gas housing 109 follow one another along the rotor 103.

The annular combustion chamber 110 is in communication with a, for example, annular hot-gas duct 111, where, by way of example, four successive turbine stages 112 form the turbine 108.

Each turbine stage 112 is formed, for example, from two blade or vane rings. As seen in the direction of flow of a working medium 113, in the hot-gas duct 111 a row of guide vanes 115 is followed by a row 125 formed from rotor blades 120.

The guide vanes 130 are secured to an inner housing 138 of a stator 143, whereas the rotor blades 120 of a row 125 are fitted to the rotor 103 for example by means of a turbine disk 133.

A generator (not shown) is coupled to the rotor 103.

While the gas turbine 100 is operating, the compressor 105 sucks in air 135 through the intake housing 104 and compresses it. The compressed air provided at the turbine-side end of the compressor 105 is passed to the burners 107, where it is mixed with a fuel. The mix is then burnt in the combustion chamber 110, forming the working medium 113. From there, the working medium 113 flows along the hot-gas duct 111 past the guide vanes 130 and the rotor blades 120. The working medium 113 is expanded at the rotor blades 120, transferring its momentum, so that the rotor blades 120 drive the rotor 103 and the latter in turn drives the generator coupled to it.

While the gas turbine 100 is operating, the components which are exposed to the hot working medium 113 are subject to thermal stresses. The guide vanes 130 and rotor blades 120 of the first turbine stage 112, as seen in the direction of flow of the working medium 113, together with the heat shield elements which line the annular combustion chamber 110, are subject to the highest thermal stresses.

To be able to withstand the temperatures which prevail there, they can be cooled by means of a coolant.

Substrates of the components may likewise have a directional structure, i.e. they are in single-crystal form (SX structure) or have only longitudinally oriented grains (DS structure).

By way of example, iron-base, nickel-base or cobalt-base super alloys are used as material for the components, in particular for the turbine blade or vane 120, 130 and components of the combustion chamber 110.

Super alloys of this type are known, for example, from EP 1 204 776 B1, EP 1 306 454, EP 1 319 729 A1, WO 99/67435 or WO 00/44949; these documents form part of the disclosure with regard to the chemical composition of the alloys.

The guide vane 130 has a guide vane root (not shown here), which faces the inner housing 138 of the turbine 108, and a guide vane head which is at the opposite end from the guide vane root. The guide vane head faces the rotor 103 and is fixed to a securing ring 140 of the stator 143.

FIG. 4 shows a perspective view of a rotor blade 120 or guide vane 130 of a turbo machine, which extends along a longitudinal axis 121.

The turbo machine may be a gas turbine of an aircraft or of a power plant for generating electricity, a steam turbine or a compressor.

The blade or vane 120, 130 has, in succession along the longitudinal axis 121, a securing region 400, an adjoining blade or vane platform 403 as well as a main blade or vane part 406 and a blade or vane tip 415.

As a guide vane 130, the vane 130 may have a further platform (not shown) at its vane tip 415.

A blade or vane root 183, which is used to secure the rotor blades 120, 130 to a shaft or a disk (not shown), is formed in the securing region 400.

The blade or vane root 183 is designed, for example, in hammerhead form. Other configurations, such as a fir-tree or dovetail root, are possible.

The blade or vane 120, 130 has a leading edge 409 and a trailing edge 412 for a medium which flows past the main blade or vane part 406.

In the case of conventional blades or vanes 120, 130, by way of example solid metallic materials, in particular super alloys, are used in all regions 400, 403, 406 of the blade or vane 120, 130.

Super alloys of this type are known, for example, from EP 1 204 776 B1, EP 1 306 454, EP 1 319 729 A1, WO 99/67435 or WO 00/44949; these documents form part of the disclosure with regard to the chemical composition of the alloy.

The blade or vane 120, 130 may in this case be produced by a casting process, also by means of directional solidification, by a forging process, by a milling process or combinations thereof.

Work pieces with a single-crystal structure or structures are used as components for machines which, in operation, are exposed to high mechanical, thermal and/or chemical stresses.

Single-crystal work pieces of this type are produced, for example, by directional solidification from the melt. This involves casting processes in which the liquid metallic alloy solidifies to form the single-crystal structure, i.e. the single-crystal work piece, or solidifies directionally.

In this case, dendritic crystals are oriented along the direction of heat flow and form either a columnar crystalline grain structure (i.e. grains which run over the entire length of the work piece and are referred to here, in accordance with the language customarily used, as directionally solidified) or a single-crystal structure, i.e. the entire work piece consists of one single crystal. In these processes, a transition to globular (polycrystalline) solidification needs to be avoided, since non-directional growth inevitably forms transverse and longitudinal grain boundaries, which negate the favorable properties of the directionally solidified or single-crystal component.

Where the text refers in general terms to directionally solidified microstructures, this is to be understood as meaning both single crystals, which do not have any grain boundaries or at most have small-angle grain boundaries, and columnar crystal structures, which do have grain boundaries running in the longitudinal direction but do not have any transverse grain boundaries. This second form of crystalline structures is also described as directionally solidified microstructures (directionally solidified structures).

Processes of this type are known from U.S. Pat. No. 6,024,792 and EP 0 892 090 A1; these documents form part of the disclosure with regard to the solidification process.

The blades or vanes 120, 130 may likewise have coatings to protect them against corrosion or oxidation, e.g. (MCrAlX: M is at least one element selected from the group consisting of iron (Fe), cobalt (Co), nickel (Ni), X is an active element and represents yttrium (Y) and/or silicon and/or at least one rare earth element, or hafnium (Hf)). Alloys of this type are known from EP 0 486.489 B1, EP 0 786 017 B1, EP 0 412 397 B1 or EP 1 306 454 A1, which are intended to form part of the present disclosure with regard to the chemical composition of the alloy. The density is preferably 95% of the theoretical density.

A protective aluminum oxide layer (TGO=thermal grown oxide layer) forms on the MCrAlX-layer (as an intermediate layer or as the outermost layer).

It is also possible for a thermal barrier coating, which is preferably the outermost layer and comprises the layer system 1 according to the invention, to be present on the MCrAlX.

The thermal barrier coating covers the entire MCrAlX-layer.

Columnar grains are produced in the thermal barrier coating by suitable coating processes, such as for example electron beam physical vapor deposition (EB-PVD).

Other coating processes are conceivable, for example atmospheric plasma spraying (APS), LPPS, VPS or CVD. The thermal barrier coating may have porous grains which include micro-cracks or macro-cracks, in order to improve the resistance to thermal shocks. The thermal barrier coating is therefore preferably more porous than the MCrAlX-layer.

The blade or vane 120, 130 may be hollow or solid in form.

If the blade or vane 120, 130 is to be cooled, it is hollow and may also have film-cooling holes 418 (indicated by dashed lines).

Figure 5:
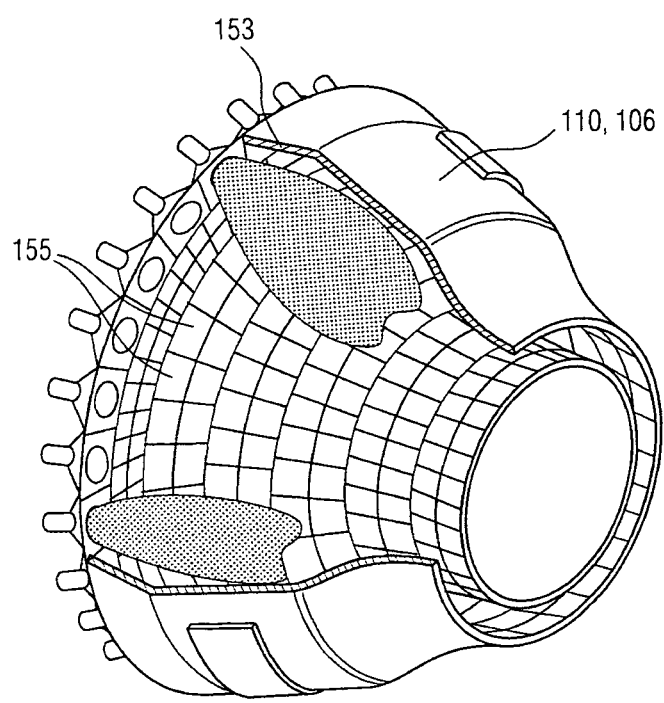
FIG. 5 shows a perspective view of a combustion chamber.

FIG. 5 shows a combustion chamber 110 of the gas turbine 100.

The combustion chamber 110 is configured, for example, as what is known as an annular combustion chamber, in which a multiplicity of burners 107 arranged circumferentially around an axis of rotation 102 open out into a common combustion chamber space 154, which burners generate flames 156. For this purpose, the combustion chamber 110 overall is of annular configuration positioned around the axis of rotation 102.

To achieve a relatively high efficiency, the combustion chamber 110 is designed for a relatively high temperature of the working medium M of approximately 1000° C. to 1600° C. To allow a relatively long service life even with these operating parameters, which are unfavorable for the materials, the combustion chamber wall 153 is provided, on its side which faces the working medium M, with an inner lining formed from heat shield elements 155.

Moreover, on account of the high temperatures in the interior of the combustion chamber 110, it is also possible to provide a cooling system for the heat shield elements 155 or for their holding elements. The heat shield elements 155 are then hollow, for example, and may also have cooling holes (not shown) which open out into the combustion chamber space 154.

On the working medium side, each heat shield element 155 made from an alloy is equipped with a particularly heat-resistant protective layer (MCrAlX layer and/or ceramic coating) or is made from material that is able to withstand high temperatures (solid ceramic bricks).

These protective layers may be similar to the turbine blades or vanes, i.e. for example in MCrAlX: M is at least one element selected from the group consisting of iron (Fe), cobalt (Co), nickel (Ni), X is an active element and represents yttrium (Y) and/or silicon and/or at least one rare earth element, or hafnium (Hf). Alloys of this type are known from EP 0 486 489 B1, EP 0 786 017 B1, EP 0 412 397 B1 or EP 1 306 454 A1, which are intended to form part of the present disclosure with regard to the chemical composition of the alloy.

It is also possible for a, for example, ceramic thermal barrier coating, comprising the layer system 1 according to the invention, to be present on the MCrAlX.

Columnar grains are produced in the thermal barrier coating by means of suitable coating processes, such as for example electron beam physical vapor deposition (EB-PVD).

Other coating processes are conceivable, for example atmospheric plasma spraying (APS), LPPS, VPS or CVD. The thermal barrier coating may have porous grains provided with micro-cracks or macro-cracks in order to improve its resistance to thermal shocks.

Refurbishment means that after they have been used, protective layers may have to be removed from turbine blades or vanes 120, 130, heat shield elements 155 (e.g. by sand-blasting). Then, the corrosion and/or oxidation layers and products are removed. If appropriate, cracks in the turbine blade or vane 120, 130 or the heat shield element 155 are also repaired. This is followed by recoating of the turbine blades or vanes 120, 130, heat shield elements 155, after which the turbine blades or vanes 120, 130 or the heat shield elements 155 can be reused.

The invention claimed is:

1. A layer system, comprising:
    a substrate;
    an outer ceramic layer arranged on the substrate where the ceramic layer comprises a pyrochlore structure $Gd_y(Zr_xHf_y)O_z$, where x+y=2;
    an inner ceramic layer that comprises a 6 wt %-8 wt % yttrium stabilized oxide layer arranged between the outer ceramic layer and the substrate; and
    wherein the inner ceramic layer has a layer thickness of between 10% and 50% of the total layer thickness of the inner ceramic layer and the outer ceramic layer, and the total layer thickness of the inner ceramic layer and the outer ceramic layer is about 300 µm to about 800 µm.

2. The layer system as claimed in claim 1, wherein the outer ceramic layer comprises $Gd_2(Zr_xHf_y)O_z$.

3. The layer system as claimed in claim 2, wherein the outer ceramic layer comprises $Gd_y(Zr_xHf_y)O_7$.

4. The layer system as claimed in claim 3, wherein the outer ceramic layer consists of $Gd_y(Zr_xHf_y)O_z$.

5. The layer system as claimed in claim 4, wherein the outer ceramic layer consists of $Gd_2(Zr_xHf_y)O_7$ where x+y=2.

6. The layer system as claimed in claim 5, wherein the mixing ratio of hafnium and zirconium is selected from the group consisting of: 10:90, 20:80, 30:70, 40:60, 50:50, 60:40, 70:30, 80:20, and 90:10.

7. The layer system as claimed in claim 5, wherein y>x.

8. The layer system as claimed in claim 5, wherein y<x.

9. The layer system as claimed in claim 1, wherein the combined layer thickness of the inner ceramic layer and the outer ceramic layer is 300 µm.

10. The layer system as claimed in claim 1, wherein the combined layer thickness of the inner layer and the outer layer is 400 µm.

11. The layer system as claimed in claim 1, further comprising a metallic NiCoCrAlX alloy bonding layer arranged on the substrate and beneath the inner ceramic layer or beneath the outer ceramic layer.

12. The layer system as claimed in claim 11, wherein the metallic bonding layer has the composition (in wt %):
    11%-13% cobalt,
    20%-22% chromium,
    10.5%-11.5% aluminum,
    0.3%-0.5% yttrium,
    1.5%-2.5% rhenium, and
    remainder nickel.

13. The layer system as claimed in claim 11, wherein the metallic bonding layer has the composition (in wt %):
    24%-26% cobalt,
    16%-18% chromium,
    9.5%-10.5% aluminum,
    0.3%-0.5% yttrium,
    1%-2.0% rhenium, and
    remainder nickel.

14. The layer system as claimed in claim 11, wherein the metallic bonding layer has the composition (in wt %) consisting of:
    29%-31% nickel,
    27%-29% chromium,
    7%-9% aluminum,
    0.5%-0.7% yttrium,
    0.6%-0.8% silicon, and
    remainder cobalt.

15. The layer system as claimed in claim 11, wherein the metallic bonding layer (7) has the composition (in wt %) consisting of:
    27%-29% nickel,
    23%-25% chromium,
    9%-11% aluminum,
    0.3%-0.7% yttrium, and
    remainder cobalt.

* * * * *